United States Patent [19]

Miyauchi et al.

[11] Patent Number: 5,196,919

[45] Date of Patent: Mar. 23, 1993

[54] USE OF A CONTAMINATION SHIELD DURING THE MANUFACTURE OF SEMICONDUCTOR PACKAGES

[75] Inventors: Nobuaki Miyauchi; Hiroshi Yonemasu; Bakji Cho, all of San Diego, Calif.

[73] Assignee: Kyocera America, Inc., San Diego, Calif.

[21] Appl. No.: 623,601

[22] Filed: Dec. 7, 1990

[51] Int. Cl.⁵ ............................................. H01L 23/04
[52] U.S. Cl. ......................................... 357/74; 357/84
[58] Field of Search ........................... 357/74, 72, 84; 174/52.4; 264/272.17; 65/32.2, 26, 36

[56] References Cited

U.S. PATENT DOCUMENTS

| | | | |
|---|---|---|---|
| 4,326,214 | 4/1982 | Trueblood | 357/74 |
| 4,352,119 | 9/1982 | Bardens et al. | 357/74 |
| 4,630,095 | 12/1986 | Otsuka et al. | 357/74 |
| 4,663,833 | 5/1987 | Tanaka et al. | 264/272.17 |
| 5,033,615 | 7/1991 | Shima et al. | 428/76 |
| 5,043,004 | 8/1991 | Miyauchi | 357/74 |

FOREIGN PATENT DOCUMENTS 0175489  3/1986  European Pat. Off. ....... 264/272.17

Primary Examiner—Rolf Hille
Assistant Examiner—S. V. Clark
Attorney, Agent, or Firm—Spensley Horn Jubas & Lubitz

[57] ABSTRACT

A protective shield is provided on the UV transparent window of a ceramic lid for a EPROM integrated circuit package so as to prevent accumulation of foreign particulate matter thereon during the manufacture of the package.

10 Claims, 1 Drawing Sheet

USE OF A CONTAMINATION SHIELD DURING THE MANUFACTURE OF SEMICONDUCTOR PACKAGES

BACKGROUND OF THE INVENTION

1. Field of the Invention

This invention relates to the manufacture of semiconductor integrated circuit packages, and more particularly to the manufacture of semiconductor integrated circuit packages incorporating a transparent window, which are commonly used to encase erasable programmable read only memory ("EPROM") devices.

2. Description of Related Art

In recent years, EPROM devices have been encased in semiconductor integrated circuit ("IC") packages which incorporate a window that is transparent to certain wave-lengths of radiation commonly used to erase an EPROM device, such as ultraviolet ("UV") radiation. The inclusion of the window permits data stored on an EPROM device to be erased or rewritten by directing ultraviolet radiation through the window and onto the enclosed EPROM circuit.

Substantial economies have resulted from the use of the windowed IC package, since the enclosed EPROM circuit need not be discarded and replaced but simply erased and reprogrammed when new data is required.

Generally, windowed IC packages are made of ceramic and glass and are comprised of two basic components: (1) a base incorporating an embedded lead frame surrounding a central cavity in which the EPROM circuit will ultimately be affixed; and (2) a ceramic lid for the base incorporating a transparent window. The base and lid are manufactured separately and sealed together after an EPROM circuit has been mechanically affixed to the interior of the cavity of the base and electrically connected to the lead frame.

Commonly, the ceramic lid is manufactured in a three-step process: (1) a substrate, which ordinarily conforms to the size and shape of the base, is created incorporating a central opening corresponding to the position of the base; (2) a window, often made of glass, sapphire or quartz, and which is transparent to ultraviolet radiation, is affixed to the substrate so as to plug and seal the central opening; (3) the interior surface of the substrate, exclusive of the window and its surrounding area, is screened with a sealing glass material, which when attached to the base and heated to high temperatures will seal the lid to the base.

A disadvantage of the prior art has been that during the manufacturing, packing and shipping processes involving the lid, especially the process during which the sealing glass material is screened onto the substrate, foreign particulate matter collects in the vicinity of the window and often adheres to the window. Such foreign particulate matter often remains on the interior surface of the lid and the window despite efforts to clean them before the lid and the base are sealed together. Once the EPROM circuit has been affixed to the base and the base and lid sealed, the foreign particulate matter can have several deleterious effects. First, since line widths on high-density EPROM circuits are now less than one micron, even relatively small foreign particles falling from the interior surface of the lid or the window and landing on the EPROM device may bridge across circuit traces resulting in undesirable short circuits, and thus impair the ability to reprogram the EPROM circuit once the prior data has been erased. Second, foreign particulate matter adhering to the window may totally shield or partially obscure the EPROM circuit from ultraviolet radiation directed through the window, thereby impairing the ability to fully erase old data.

Accordingly, as the semiconductor industry moves forward to manufacturing more highly integrated EPROM devices, there is an ever-increasing need to minimize or eliminate the noted contamination problems and to provide a ceramic lid having a high-grade UV transparent window suitable for use in a high-density EPROM package.

SUMMARY OF THE INVENTION

In view of the foregoing, it is a prime object of this invention to provide an IC package including a ceramic lid and a UV transparent window hermetically sealed thereto, the surfaces of which are substantially free from foreign particulate matter.

It has now been found that a protective shield can be effectively used to cover the surfaces of a UV transparent window and the interior of any cavity formed in a ceramic lid when the lid is glass printed, packed, and shipped for the assembly of an IC package. The protective shield, when removed, removes with it all or most of the foreign particulate matter that otherwise would have collected in the cavity or adhered to the window.

In accordance with this invention, there is provided:

a ceramic lid for an erasable programmable read only memory package comprising:

a ceramic lid substrate having an opening formed therethrough;

an ultraviolet transparent window positioned within the opening of the ceramic lid substrate, the window having a first surface and hermetically sealing the opening by being fused to the ceramic lid substrate; and a protective shield removably covering substantially the entire first surface of the ultraviolet transparent window, the protective shield preventing accumulation of foreign particulate matter on the first surface of window.

In accordance with this invention, there is also provided:

a process for forming a ceramic lid for an erasable programmable memory package, the ceramic lid including a hermetically sealed ultraviolet transparent window, the surfaces of which are substantially free from foreign particulate matter, the process comprising the steps of:

providing a ceramic lid comprising: a ceramic lid substrate having an opening formed therethrough and a first surface; an ultraviolet transparent window positioned within the opening, the window having a first surface and hermetically sealing the opening by being fused to the ceramic lid substrate;

covering substantially the entire first surface of the window with a removable protective shield, the protective shield preventing accumulation of foreign particulate matter on the first surface;

coating the first surface of the ceramic lid substrate with a sealing glass;

firing the ceramic lid at a high temperature sufficient to glaze the sealing glass, whereby the sealing glass melts into a continuous glaze and bonds to the ceramic lid substrate; and removing the protective shield from the first surface of the window, whereby the first surface remains substantially free from foreign particulate matter.

The above objects, as well as further objects, features and advantages of this invention, will be more fully understood by reference to the following detailed description and drawings.

BRIEF DESCRIPTION OF THE DRAWINGS

Like reference numbers in the drawings refer to like elements.

DETAILED DESCRIPTION OF THE INVENTION

Figure 1A:
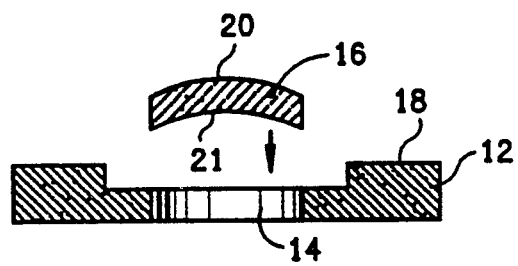
FIGS. 1(a)-(e) are sectional views showing a manner in which a ceramic lid is formed according to a process of this invention.
Figure 1B:
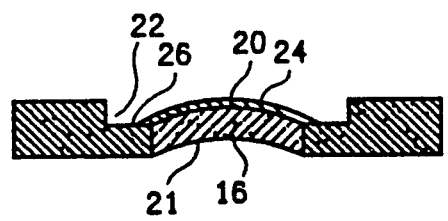

Referring to FIGS. 1(a)-1(d), the process of forming an IC package component 10 can be readily understood. A ceramic lid 12 has a preformed opening 14 at its center, the size of which is adapted to receive a UV transparent window 16. The lid 12 has a first surface 18 to be coated with a sealing glass layer. The window 16 has a corresponding first surface 20, as well as a second surface 21. Although the first window surface 20 is shown in FIG. 1 as being concave and the second window surface 21 is shown as convex, both surfaces can be planar. The convex second surface 21 is preferable as compared to a planar face because the shape of the second surface 21 protects the window from damage (e.g., scratches) while the lid is being carried on a conveyor during various manufacturing stages.

The lid 12 is made of any ceramic material, such as one of the oxides of aluminum, beryllium, and/or magnesium, or of silicon nitride, which are conveniently employed in the semiconductor industry. The window 16 can be any material that will pass UV, such as quartz glass, sapphire, or alumina borosilicate, preferably having a coefficient of thermal expansion matching that of the lid 12.

The window 16 is mounted and sealed directly within the opening 14 to form a hermetic seal. This may be carried out by firing the window 16 at around 800° C. in an inert atmosphere, once it is fitted within the opening 14, whereby the window 16 hermetically fuses to the lid 12.

Inert atmospheres of nitrogen and hydrogen are useful, although air may be used, but less preferably. The opening 14 may be a part of a greater cavity 22 formed in the lid 12.

Next, a protective shield 24 is placed on the first window surface 20 so as to substantially cover the entire area of the window 16, but such that the shield 24 can easily be removed therefrom, as desired. If the cavity 22 is provided, the shield 24, preferably, extends over the first window surface 20 to enclose the interior surface 26 of the cavity 22 at least around the periphery of the first window surface 20. The protective shield 24 may be made of any material as long as the material can conform to the contour of the first window surface 20 and can effectively cover the first window surface 20 even at elevated temperatures. Metallic film is preferred, and a thin (approximately 0.001 inches) film of aluminum is especially preferred. The protective shield 24 is designed to prevent accumulation of foreign particulate matter on the first window surface 20 and the cavity interior surface 26 during subsequent glass printing and other processings. Without such a protective means, the first window surface 20 would be easily contaminated by foreign particulate matter such as glass or metal which adheres to or embeds in the window 16.

Figure 1C:
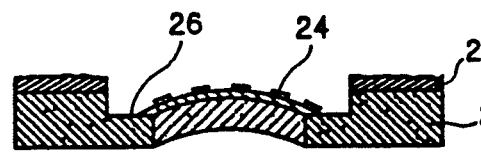

Once the protective shield 24 is in place, the lid 12 is subjected to a conventional screen printing operation. This operation applies glass in a predetermined pattern onto the first lid surface 18, leaving an uncoated area in the inner area of the lid 12. For example, as shown in FIG. 1(c), the cavity interior 26 is not coated with glass, nor is the first window surface 20. In a preferred embodiment, the application of glass is performed by coating the lid 12 with a sealing glass. Although the specific sealing glass is not critical, it is desirable that it have a coefficient of thermal expansion which closely matches that of the other components of a semiconductor package. An exemplary glass is a lead borosilicate type glass sealing matrix. To prepare the sealing glass used in this invention, a base glass, in powder form, is blended with a conventional vehicle. Then, the sealing glass obtained in paste form is applied to the lid 12 through a screen to produce a glass coating 28. During this screen printing process, the protective shield 24 prevents glass dust or any other foreign particulate matter from accumulating on the first window surface 20 and on the cavity interior 26.

Figure 1D:

The glass coated lid 29 is heated to a temperature of about 250° C. to remove the vehicle, then heated further to a temperature of about 450° C. for about 20 minutes to fuse the glass coating 28 to the lid 12. In this operation, the glass coating 28 flows into a continuous glaze (glazing) to form a glazed coating 30, as shown in FIG. 1(d).

Figure 1E:

After the above glazing step has been completed, the protective shield 24 may be removed from the lid 12, leaving a lid component 10 having clean window surface and a clean lid interior, both of which are substantially free from foreign particulate matter, as shown in FIG. 1(e). Preferably, however, the shield 24 may be retained during further processing stages such as packing and shipping, thereby further protecting the window 16 from contamination by foreign matter. The shield 24 must be removed, at the latest, just prior to assembling an IC package 32 (FIG. 2).

Figure 2:
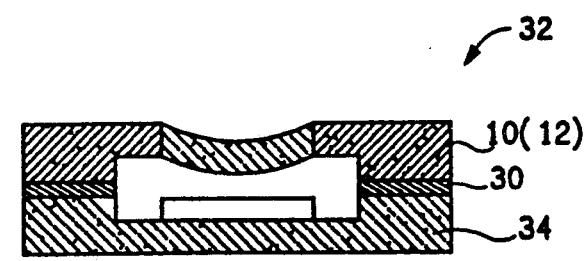
FIG. 2 is a sectional view of a packaged EPROM device incorporating a ceramic lid formed according to a process of this invention.

Referring now to FIG. 2, the IC package 32 is finally sealed by stacking a lid component 10 onto a base component 34. The stacked components are then fired to a temperature of about 400° C. to about 500° C. for about 5 to about 15 minutes to melt the glazing 30 between the lid 12 and the base 34 to hermetically seal the IC package 32.

This invention thus insures that the window of an IC package lid remain substantially free from foreign particulate matter during the manufacturing of the package. The package lid produced by the process of this invention is particularly suited for use in a package for high density EPROM integrated circuits.

Although this invention has been described by way of several embodiments thereof, it should be realized that many alternatives, modifications, and variations will be apparent to those skilled in the art of the foregoing description. Accordingly, it is intended to embrace all such alternatives, modifications, and all variations as falling within the spirit and broad scope of the appended claims.

We claim:

1. A ceramic lid for an erasable programmable read only memory package comprising:
    a ceramic lid substrate having an opening formed therethrough and a first surface;
    an ultraviolet transparent window positioned within the opening of the ceramic lid substrate, the window having a first surface and a second surface and hermetically sealing the opening by being fused to the ceramic lid substrate; and
    a protective shield removably covering substantially the entire first surface of the ultraviolet transparent window, the protective shield preventing accumulation of foreign particulate matter on the first surface of the window.

2. The ceramic lid according to claim 1, wherein the protective shield is made of a metallic film.

3. The ceramic lid according to claim 2, wherein the metallic film is a thin layer of aluminum.

4. The ceramic lid according to claim 1, wherein the ceramic lid substrate is provided with a cavity surrounding the first surface of the window.

5. The ceramic lid according to claim 4, wherein the protective shield extends over the interior surface of the cavity at least around the periphery of the window.

6. The ceramic lid according to claim 5, wherein the protective shield is made of a metallic film.

7. The ceramic lid according to claim 6, wherein the metallic film is a thin film of aluminum.

8. The ceramic lid according to claim 1, further comprising a sealing glass coating on the first surface of the ceramic lid substrate.

9. The ceramic lid according to claim 8, wherein the sealing glass coating is glazed.

10. The ceramic lid according to claim 1, wherein the first surface of the window is concave and the second surface of the window is convex.

* * * * *